(12) United States Patent
Oba et al.

(10) Patent No.: US 12,114,570 B2
(45) Date of Patent: Oct. 8, 2024

(54) THERMOELECTRIC GENERATOR MODULE

(71) Applicant: KELK Ltd., Kanagawa (JP)

(72) Inventors: Masakazu Oba, Kanagawa (JP);
Toshihiko Kishizawa, Kanagawa (JP);
Yoshitsugu Kitsu, Kanagawa (JP)

(73) Assignee: KELK Ltd., Kanagawa (JP)

( * ) Notice: Subject to any disclaimer, the term of this patent is extended or adjusted under 35 U.S.C. 154(b) by 246 days.

(21) Appl. No.: 17/592,082

(22) Filed: Feb. 3, 2022

(65) Prior Publication Data

US 2022/0254978 A1 Aug. 11, 2022

(30) Foreign Application Priority Data

Feb. 8, 2021 (JP) .................................. 2021-018513

(51) Int. Cl.
*H10N 10/17* (2023.01)
*H10N 10/82* (2023.01)

(52) U.S. Cl.
CPC .............. *H10N 10/17* (2023.02); *H10N 10/82* (2023.02)

(58) Field of Classification Search
CPC ......... H10N 10/17; H10N 10/82; Y02E 20/12
See application file for complete search history.

(56) References Cited

U.S. PATENT DOCUMENTS

| | | | | |
|---|---|---|---|---|
| 3,225,549 A * | 12/1965 | Elfving | .................. | H10N 10/17 136/223 |
| 10,665,768 B2 * | 5/2020 | Hamano | ................ | H10N 10/17 |
| 11,469,361 B2 * | 10/2022 | Lee | ......................... | H10N 10/13 |
| 2014/0216516 A1 | 8/2014 | Makino et al. | | |
| 2017/0279027 A1 * | 9/2017 | Himmer | .................. | F01N 5/025 |

FOREIGN PATENT DOCUMENTS

| | | |
|---|---|---|
| JP | H04-329658 A | 11/1992 |
| JP | 2000-049423 A | 2/2000 |
| JP | 2002-147888 A | 5/2002 |
| JP | 2002-232027 A | 8/2002 |
| JP | 2006-066431 A | 3/2006 |
| JP | 2006-114622 A | 4/2006 |
| JP | 2006-303320 A | 11/2006 |
| JP | 2012-243879 A | 12/2012 |
| JP | 2013080883 | 5/2013 |
| JP | 2014-007376 A | 1/2014 |
| JP | 2016-009787 A | 1/2016 |

\* cited by examiner

*Primary Examiner* — Ana M Vazquez
(74) *Attorney, Agent, or Firm* — Fish & Richardson P.C.

(57) ABSTRACT

A thermoelectric generator module includes a first base material that is formed into a sheet and that has a thermoplastic layer, a second base material that is formed into a sheet and that has a thermoplastic layer, a plurality of thermoelectric conversion elements arranged between the first base material and the second base material, a plurality of first electrodes arranged between the first base material and the thermoelectric conversion elements, a plurality of second electrodes arranged between the second base material and the thermoelectric conversion elements, and a joint that joins the first base material to the second base material. The thermoelectric conversion elements, the plurality of first electrodes, and the plurality of second electrodes are sealed by the joint.

15 Claims, 10 Drawing Sheets

THERMOELECTRIC GENERATOR MODULE

CROSS-REFERENCE TO RELATED APPLICATION(S)

The present application claims priority to and incorporates by reference the entire contents of Japanese Patent Application No. 2021-018513 filed in Japan on Feb. 8, 2021.

BACKGROUND OF THE INVENTION

1. Field of the Invention

The present disclosure relates to a thermoelectric generator module.

2. Description of the Related Art

Thermoelectric generator modules are used in factories and facilities that perform incineration and heat treatments, and therefore operate in environments that are exposed to wind and rain, high humidity and high temperatures, and dust. Therefore, thermoelectric generator modules, in which potential differences are generated, are prone to short-circuits due to water and dust becoming electrical circuits. Thus, thermoelectric generator modules are sealed by a sealing member to prevent water and dust from invading the module.

A technology is known according to which the outside of a thermoelectric generator module is surrounded with an O-ring, and favorable adhesion with the O-ring is maintained by using a biasing member to absorb the deformation of a heat exchanger plate, thereby improving the sealing performance (see, for example, JP 2013-080883 A).

When the heat resistance of the sealing member is low, the sealing member may thermally decompose and have a lower molecular weight in a high temperature environment. A sealing member with a lower molecular weight has a reduced sealing performance. Thus, water and dust may invade the thermoelectric generator module, resulting in an electrical circuit. In addition, there is a risk that the insulating member disposed inside the thermoelectric generator module will become humid, resulting in a loss of insulation properties.

SUMMARY OF THE INVENTION

It is an object of the present invention to at least partially solve the problems in the conventional technology.

According to an aspect of the present invention, a thermoelectric generator module includes a first base material that is formed into a sheet and that has a thermoplastic layer, a second base material that is formed into a sheet and that has a thermoplastic layer, a plurality of thermoelectric conversion elements arranged between the first base material and the second base material, a plurality of first electrodes arranged between the first base material and the thermoelectric conversion elements, a plurality of second electrodes arranged between the second base material and the thermoelectric conversion elements, and a joint that joins the first base material to the second base material. The thermoelectric conversion elements, the plurality of first electrodes, and the plurality of second electrodes are sealed by the joint.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Although embodiments of the present disclosure are described hereinbelow with reference to the drawings, the present disclosure is not limited to or by such embodiments. Constituent elements of the plurality of embodiments described hereinbelow can, where appropriate, be combined. Moreover, some of the constituent elements may sometimes not be used.

In the embodiment, the terms "left", "right", "front", "back", "top", and "bottom" are used to describe the positional relationships between the parts. These terms indicate the relative position or direction with respect to the center of a thermoelectric generator module 1. The left-right direction, the front-back direction, and the up-down direction are orthogonal.

First Embodiment

Thermoelectric Generator Module

Figure 1:
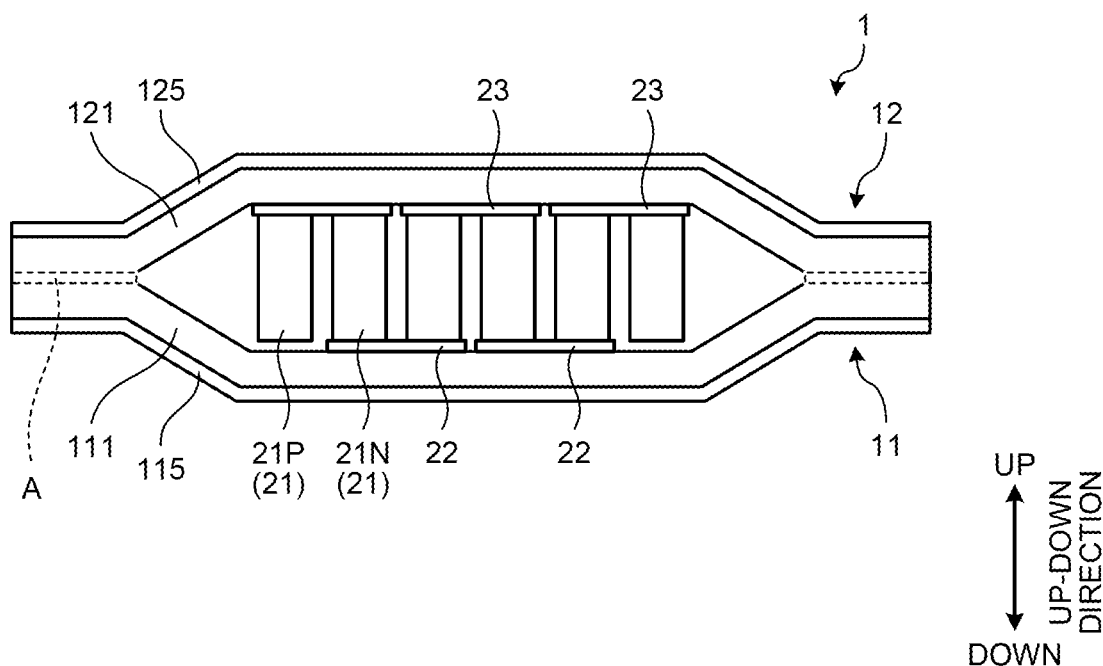
FIG. 1 is a cross-sectional view schematically illustrating a thermoelectric generator module according to a first embodiment.
Figure 2:
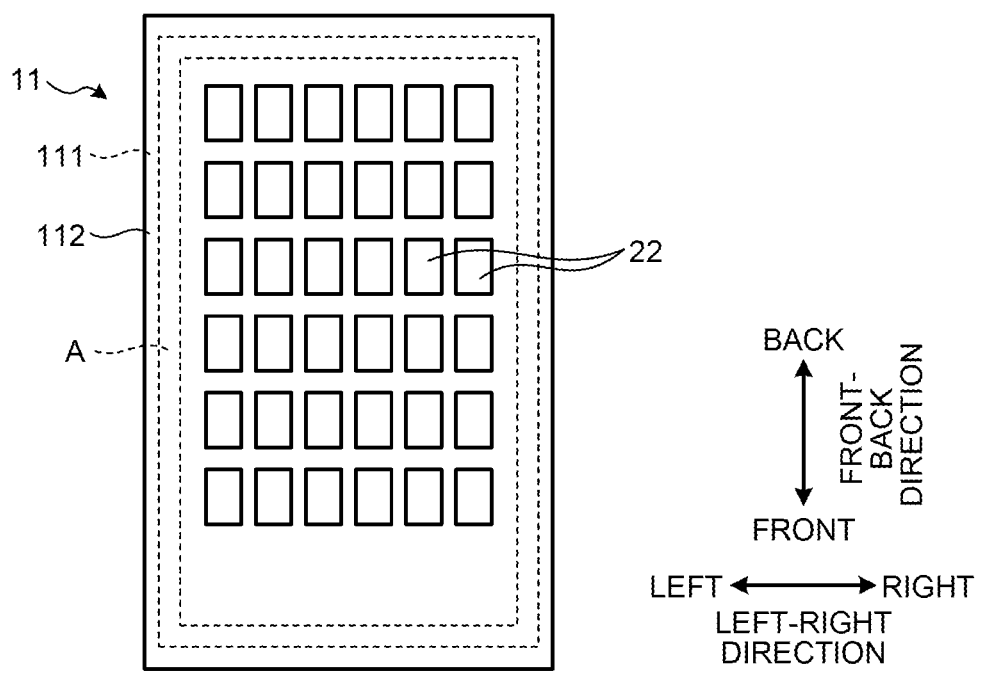
FIG. 2 is a plan view schematically illustrating, from above, a first base material of the thermoelectric generator module according to the first embodiment.
Figure 3:
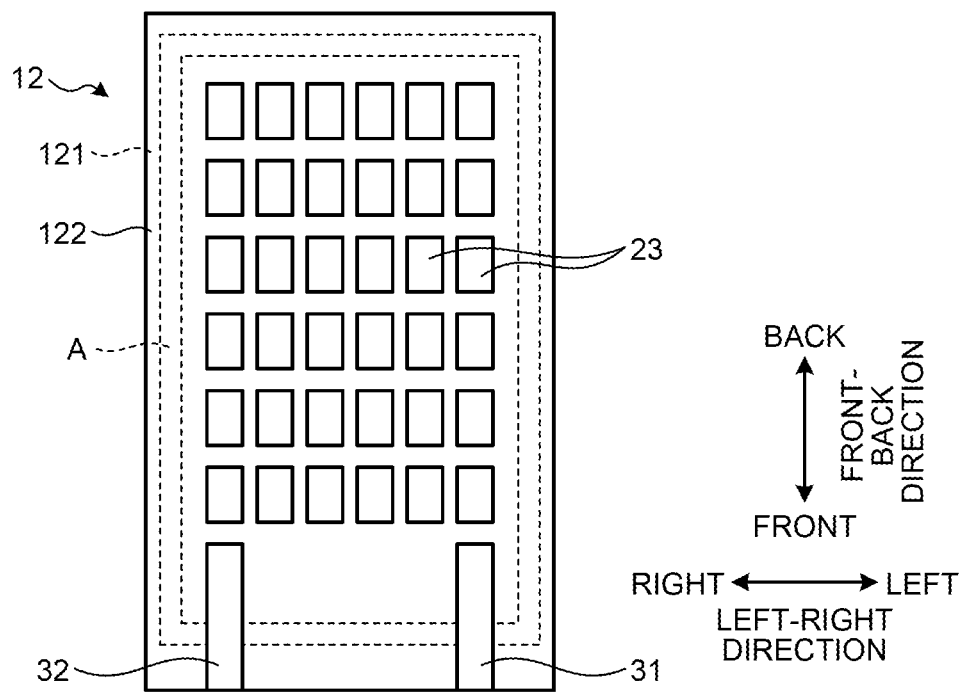
FIG. 3 is a plan view schematically illustrating, from below, a second base material of the thermoelectric generator module according to the first embodiment.

FIG. 1 is a cross-sectional view schematically illustrating the thermoelectric generator module according to the first embodiment. FIG. 2 is a plan view schematically illustrating, from above, a first base material of the thermoelectric generator module according to the first embodiment. FIG. 3 is a plan view schematically illustrating, from below, a second base material of the thermoelectric generator module according to the first embodiment. The thermoelectric generator module 1 is installed between a high-temperature plate and a low-temperature plate, which are not illustrated in the drawing. The thermoelectric generator module 1 generates electricity through the Seebeck effect by providing a temperature difference on both sides (top and bottom in the drawing) between the high-temperature plate and the low-temperature plate.

As illustrated in FIG. 1, the thermoelectric generator module 1 has a first base material 11, a second base material 12, and a thermoelectric conversion element 21 disposed between the first base material 11 and the second base material 12. The arrangement of the thermoelectric conversion element 21, a first electrode 22 and a second electrode 23 in each drawing used in the following description is illustrated schematically.

The first base material 11 and the second base material 12 are each formed from an electrically insulating material. As illustrated in FIGS. 2 and 3, in the embodiment, the first base material 11 and the second base material 12 are each formed into a sheet. The first base material 11 and the second base material 12 are each flexible. In the embodiment, the first base material 11 and the second base material 12 are formed in a rectangular shape. The first base material 11 and the second base material 12 face each other so as to sandwich the thermoelectric conversion element 21. In the embodiment, the second base material 12 is disposed above the first base material 11.

Figure 4:
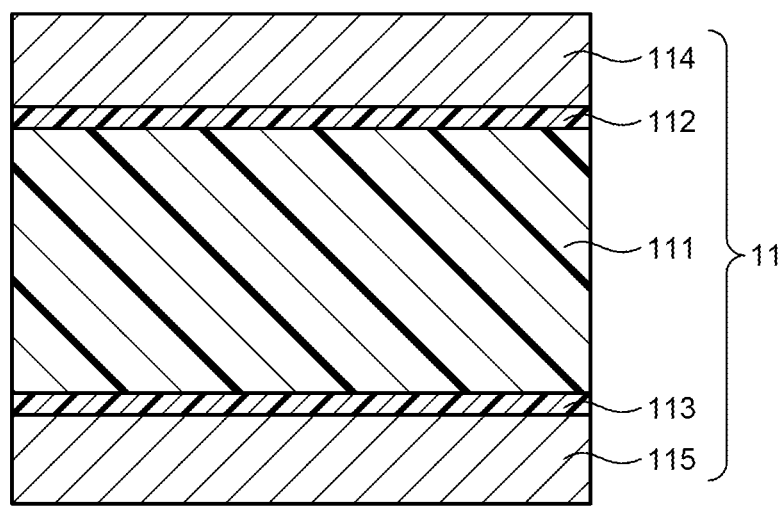
FIG. 4 is a cross-sectional view schematically illustrating the first base material.

FIG. 4 is a cross-sectional view schematically illustrating the first base material. In the embodiment, the first base material 11 is a three-layer structure with a first layer 111, a second layer (metal layer) 114, and a third layer (shield layer) 115. In the embodiment, the first base material 11 is laminated in the following order from below: the third layer 115, a thermoplastic layer 113, the first layer 111, a thermoplastic layer 112, and then the second layer 114.

The first layer 111 is configured from polyimide in sheet form. The thickness of the first layer 111 is 25 μm, for example. The first layer 111 has the thermoplastic layer 112 on the top surface side and the thermoplastic layer 113 on the bottom surface side.

The thermoplastic layer 112 and the thermoplastic layer 113 are arranged across the entire top and bottom surfaces of the first layer 111, or at least on the peripheral portion thereof. The thermoplastic layer 112 and thermoplastic layer 113 are softened by heating to 240° C. or higher, for example, and then cured by cooling. As a result, when the thermoplastic layer 112 or thermoplastic layer 113 is heated while stacked on an object, same are joined through thermoplasticity.

The second layer 114 is stacked on the top surface side of the first layer 111. The thickness of the second layer 114 is 300 μm, for example. The thermoplastic layer 112 is interposed between the second layer 114 and the first layer 111. The second layer 114 is configured from an electrically conductive material. The second layer 114 is, for example, a copper foil. The second layer 114 is processed through etching or the like, and the remaining portion becomes the second electrode 23. In the embodiment, the second layer 114 is removed at a peripheral portion of the first base material 11, thereby exposing the thermoplastic layer 112.

The third layer 115 is stacked on the bottom surface side of the first layer 111. The thickness of the third layer 115 is 18 μm, for example. The thermoplastic layer 113 is interposed between the third layer 115 and the first layer 111. The third layer 115 is configured from a material that blocks water, because the polyimide of the first layer 111 is permeable to water. The third layer 115 is, for example, a copper foil. The high thermal conductivity of copper foil is also a desirable characteristic. The third layer 115 is in direct contact with the high-temperature plate of a thermoelectric generator device (not illustrated), or in contact via a heat-conductive grease or the like.

As illustrated in FIGS. 2 and 3, a joint A is a region that is joined through heating of the thermoplastic layer 112 and the thermoplastic layer 113. The joint A is arranged in a frame shape. The joint A is arranged around a plurality of pn element pairs that are aligned in the surface direction in an up-down direction view. The joint A is arranged on a peripheral portion of the top surface of the first base material 11.

Because the second base material 12 is configured similarly to the first base material 11, a cross-sectional view is omitted. In the embodiment, the second base material 12 is laminated in the following order from above: a third layer (shield layer) 125, a thermoplastic layer 123, a first layer 121, a thermoplastic layer 122, and then a second layer (metal layer) 124. In the embodiment, the second base material 12 is formed in a rectangular shape, with a larger surface area than the first base material 11. In the embodiment, the second base material 12 has the same length in the left-right direction as the first base material 11. In the embodiment, the length of the second base material 12 in the front-back direction is longer than that of the first base material 11. Accordingly, the width of the second base material 12 in front of the joint A is longer than that of the first base material 11. Thus, the bottom surface of the front of the second base material 12 is exposed while the first base material 11 and the second base material 12 are stacked on top of each other.

As illustrated in FIG. 1, by heating the joint A while the first base material 11 and the second base material 12 are stacked in this configuration, the peripheral portion of the top surface of the first base material 11 and the peripheral portion of the bottom surface of the second base material 12 are joined so as to be sealed.

One or more thermoelectric conversion elements 21 are arranged between the top surface side of the first base material 11 and the bottom surface side of the second base material 12. A plurality of thermoelectric conversion elements 21 are connected by a plurality of the first electrodes 22 and the second electrodes 23.

The thermoelectric conversion element 21 is formed by a thermoelectric material. Manganese silicide compounds (Mn—Si), magnesium silicide compounds (Mg—Si—Sn), skutterudite compounds (Co—Sb), half-Heusler compounds (Zr—Ni—Sn), and bismuth telluride compounds (Bi—Te) are examples of thermoelectric materials that form the thermoelectric conversion elements 21. The thermoelectric conversion element 21 may be configured from one compound selected from among manganese silicide compounds, magnesium silicide compounds, skutterudite compounds, half-Heusler compounds, and bismuth telluride compounds, or may be configured from a combination of at least two compounds.

The thermoelectric conversion element 21 includes a p-type element 21P and an n-type element 21N. A plurality of p-type elements 21P and n-type elements 21N are each arranged on a predetermined surface. The p-type elements 21P and the n-type elements 21N are arranged alternately in the front-back direction. The p-type elements 21P and the n-type elements 21N are arranged alternately in the left-right direction.

The first electrode 22 and second electrode 23 are formed by electrically conductive metals. The first electrode 22 is disposed between the first base material 11 and the thermoelectric conversion element 21. The first electrode 22 is provided on the top surface of the first base material 11. A plurality of first electrodes 22 are provided on a predetermined surface parallel to the top surface of the first base material 11. The second electrode 23 is disposed between the second base material 12 and the thermoelectric conversion element 21. The second electrode 23 is provided on the bottom surface of the second base material 12. A plurality of the second electrodes 23 are provided on a predetermined surface parallel to the bottom surface of the second base material 12. In the embodiment, the first electrode 22 is formed by processing the second layer 114 of the first base material 11. In the embodiment, the second electrode 23 is formed by processing the second layer 124 of the second base material 12.

The first electrode 22 and second electrode 23 are connected to a pair of adjacent p-type and n-type elements 21P and 21N, respectively. The first electrode 22 and second electrode 23 connect the plurality of thermoelectric conversion elements 21 in series. The first electrode 22 and second electrode 23 form a series circuit in which a plurality of thermoelectric conversion elements 21 are connected in series. The p-type element 21P and the n-type element 21N are electrically connected via the first electrode 22 and second electrode 23 to form a pn element pair. A series circuit containing a plurality of thermoelectric conversion elements 21 is configured by connecting a plurality of pn element pairs in series via the first electrode 22 and second electrode 23.

When current is supplied to the thermoelectric conversion element 21, the thermoelectric generator module 1 absorbs or generates heat by the Peltier effect. When a temperature difference is provided between the first base material 11 and the second base material 12, the thermoelectric generator module 1 generates electricity through the Seebeck effect.

The bottom surface of the first electrode 22, which is disposed on the first base material 11, is the heating surface of the thermoelectric generator module 1. The top surface of the second electrode 23, which is disposed on the second base material 12, is the cooling surface of the thermoelectric generator module 1.

Power Extraction Unit

Figure 5:
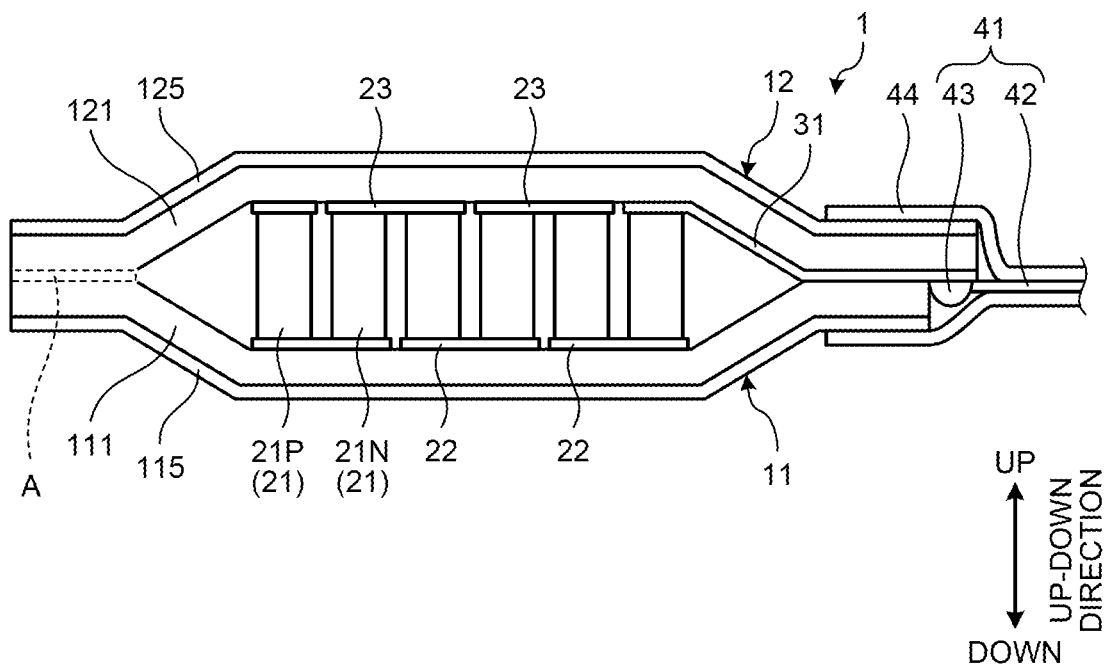
FIG. 5 is a cross-sectional view schematically illustrating the thermoelectric generator module according to the first embodiment.

In this embodiment, the power of the circuit is described as being extracted to the outside, outside the joint A. The thermoelectric generator module 1 is equipped with an end electrode 31 and an end electrode 32. The end electrode 31 and end electrode 32 are electrodes for extracting power from the circuit to the outside. The end electrode 31 and end electrode 32 are formed by electrically conductive metals. The end electrode 31 and end electrode 32 are arranged on the first base material 11 or second base material 12 and extend from the inside to the outside of the joint A. As illustrated in FIG. 3, in the embodiment, the end electrode 31 and end electrode 32 are provided on the bottom surface of the second base material 12. In the embodiment, the end electrode 31 and end electrode 32 are exposed on the bottom surface side of the peripheral portion of the second base material 12. In the embodiment, the end electrode 31 and end electrode 32 are formed by processing the second layer 124 of the second base material 12. The end electrode 31 is connected to the thermoelectric conversion element 21 at one end of the circuit. The end electrode 32 is connected to the thermoelectric conversion element 21 at the other end of the circuit. On the outside of the joint A, a lead wire (conductor) 41 illustrated in FIG. 5 is connected to the end electrode 31. The end electrode 32 is also connected similarly with a lead wire (not illustrated).

FIG. 5 is a cross-sectional view schematically illustrating the thermoelectric generator module according to the first embodiment. The lead wire 41 illustrated in FIG. 5 is electrically connected to the end electrode 31 exposed on the bottom surface side of the second base material 12. The lead wire 41 has a conductive wire 42, and a terminal 43 that is disposed at the distal end of the conductive wire 42. The conductive wire 42 is a heat-resistant conductive wire. The terminal 43 is formed from a conductive material. The terminal 43 is fixed through soldering, for example, while in contact with the end electrode 31. The connection between the end electrode 31 and the lead wire 41 is covered by a cover 44. The cover 44 seals the connection between the end electrode 31 and the lead wire 41. The cover 44 is, for example, heat shrink tubing. The cover 44 is configured from polyimide, for example. The cover 44 has a thermoplastic layer on its inner peripheral surface. The inner peripheral surface of the cover 44 is joined to the third layer 115 of the first base material 11 and to the third layer 125 of the second base material 12. The cover 44 is joined so as to sandwich the first base material 11, the end electrode 31, the lead wire 41, and the second base material 12. The lead wire (not illustrated) connected to the end electrode 32 is also configured similarly to the lead wire 41.

The thermoelectric generator module 1 thus configured is sandwiched by a high-temperature plate and a low-temperature plate, which are not illustrated.

Sealing Method and Action

The thermoplastic layer 112 of the first base material 11 and the thermoplastic layer 122 of the second base material 12 are joined by heating the joint A, which is a peripheral portion, while the first base material 11 and the second base material 12 are stacked on top of each other. As a result, the first base material 11 and the second base material 12 are sealed by joining the thermoplastic layer 112 of the first base material 11 and the thermoplastic layer 122 of the second base material 12 at the joint A, which is a peripheral portion.

In addition, the power of the circuit is extracted to the outside, outside the joint A. The connection between the end electrode 31 and the lead wire 41 is entirely covered and sealed by the cover 44.

Advantageous Effects

The embodiment enables the joining of the first base material 11 and the second base material 12 by means of the thermoplastic layer 112 and the thermoplastic layer 122, without using an adhesive or a sealing member such as a sealing material and a frame member configured from a resin material. The embodiment does not cause degradation of the adhesive or sealing member over time. According to the embodiment, the sealing performance can be maintained for a long period of time in environments that are exposed to wind and rain, high humidity and high temperatures, and dust. In this way, the embodiment does not use adhesives and resin materials with a low heat-resistance temperature, thus improving heat resistance.

The embodiment enables regulation of the intrusion of water and dust, which provoke short-circuits, into the thermoelectric generator module 1 over a long period of time in environments that are exposed to wind and rain, high humidity and high temperatures, and dust. The embodiment enables generation of thermoelectric power while maintaining insulation for a long period of time in a high temperature environment. Thus, the embodiment enables power to be stably generated by suppressing the occurrence of failures due to moisture intrusion.

The embodiment does not use a sealing member configured from a resin material or a metal material. The embodiment enables an improvement in the efficiency of thermoelectric power generation because the heat transfer path is not formed by a sealing member.

In this embodiment, the power of the circuit is extracted to the outside, on the outside of the joint A. According to the embodiment, the lead wire 41 can be connected after sealing at the joint A.

In this embodiment, the connections between the end electrodes 31 and 32 and the lead wires, which extract the power of the circuit to the outside, are sealed by the cover 44. The embodiment enables regulation of the intrusion of water and dust into the thermoelectric generator module 1 from the outside.

In the embodiment, the first base material 11 and the second base material 12 are formed in the shape of a three-layered sheet. According to the embodiment, the configuration can be simplified.

FIRST MODIFICATION EXAMPLE

Figure 6:
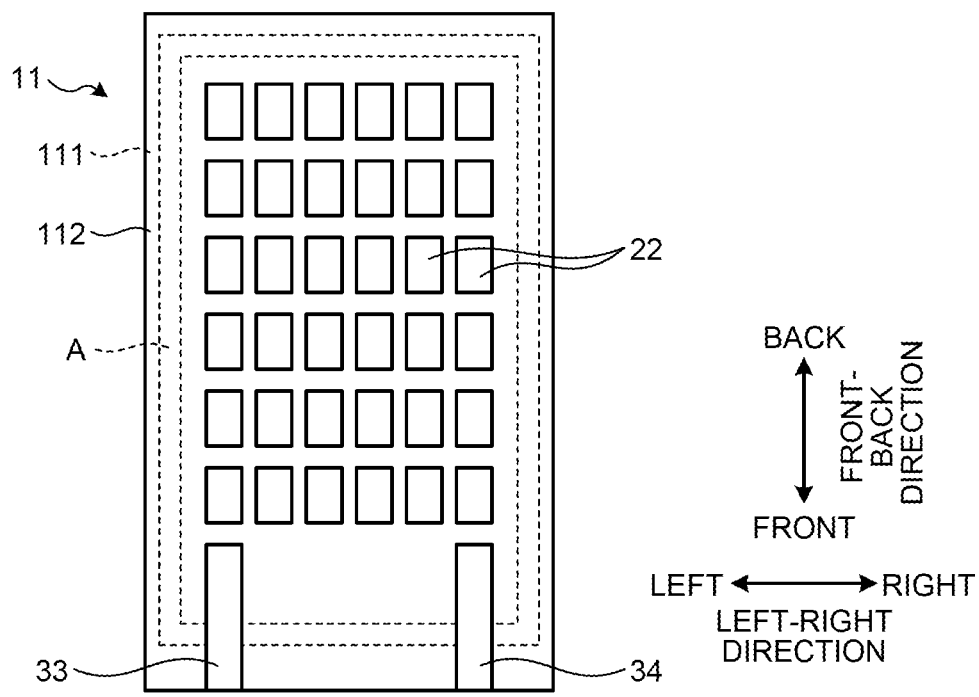
FIG. 6 is a plan view schematically illustrating, from above, the first base material of the thermoelectric generator module according to a first modification example.
Figure 7:
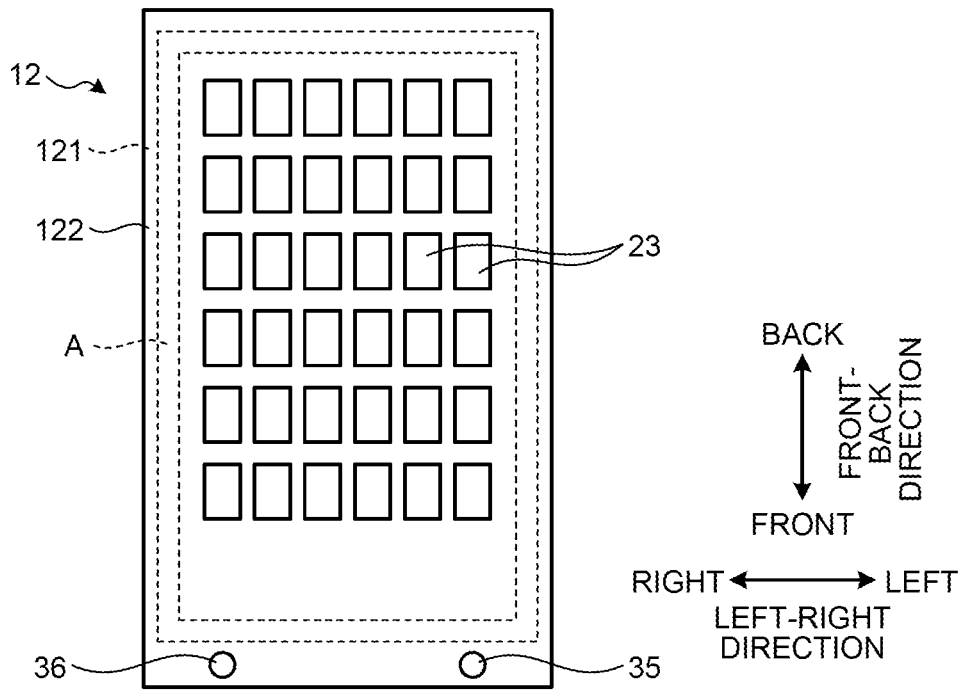
FIG. 7 is a plan view schematically illustrating, from below, the second base material of the thermoelectric generator module according to the first modification example.
Figure 8:
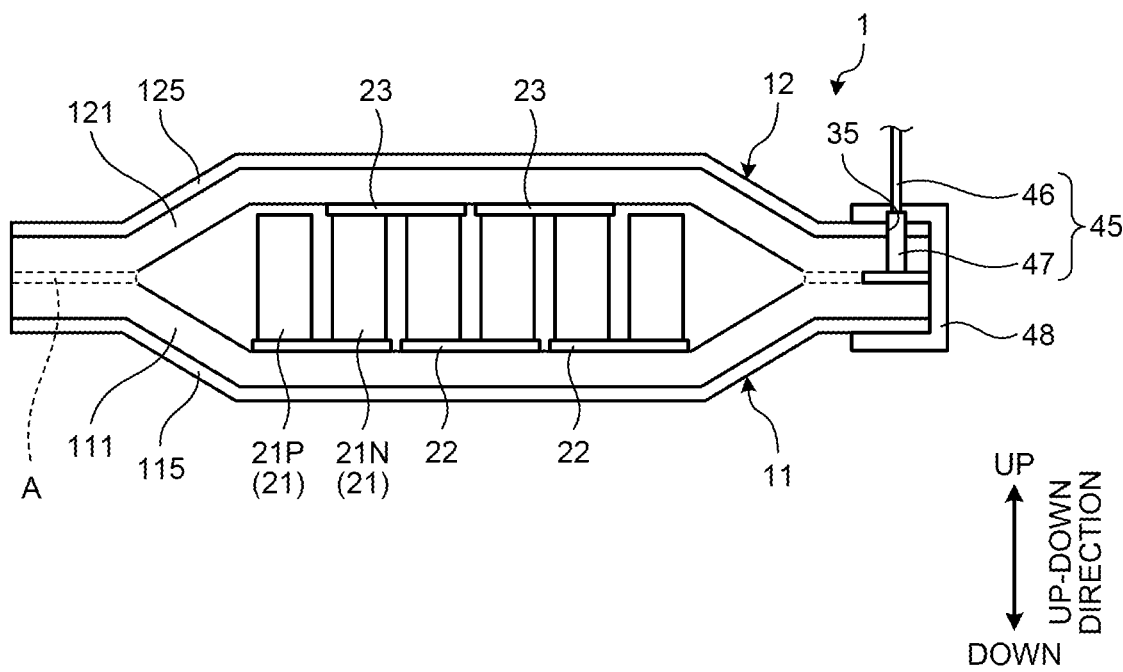
FIG. 8 is a cross-sectional view schematically illustrating the thermoelectric generator module according to the first modification example.

FIG. 6 is a plan view schematically illustrating, from above, the first base material of the thermoelectric generator module according to a first modification example. FIG. 7 is a plan view schematically illustrating, from below, the second base material of the thermoelectric generator module according to the first modification example. FIG. 8 is a cross-sectional view schematically illustrating the thermoelectric generator module according to the first modification example. The first modification example differs from the embodiment in the configuration of the power extraction unit of the circuit.

The first base material 11 and the second base material 12 are formed in a rectangular shape with the same surface area. As a result, the top surface of the first base material 11 and the bottom surface of the second base material 12 are not exposed while the first base material 11 and the second base material 12 are stacked on top of each other. A hole 35 and a hole 36, which are through holes, are formed on the outside of the joint A of the first base material 11 or the second base material 12. In the embodiment, holes 35 and 36, which are through holes, are formed on the outside of the joint A of the second base material 12.

An end electrode 33 and an end electrode 34 are provided on the top surface of the first base material 11 or the second base material 12. In the embodiment, the end electrode 33 and the end electrode 34 are provided on the top surface of the first base material 11. In the embodiment, the end electrode 33 and the end electrode 34 are formed by processing the second layer 114 of the first base material 11.

The hole 35 and hole 36 are formed so as to penetrate the first base material 11 or the second base material 12. In the embodiment, the hole 35 and the hole 36 are formed so as to penetrate the second base material 12. The hole 35 and hole 36 are arranged on the outside of the joint A. The holes 35 and 36 are arranged in positions facing the end electrode 33 and the end electrode 34 while the first base material 11 and the second base material 12 are stacked on top of each other.

A lead wire (conductor) 45 is electrically connected to the end electrode 33 exposed on the top surface side of the first base material 11. The lead wire 45 has a conductive wire 46, and a terminal 47 that is disposed at the distal end of the conductive wire 46. The conductive wire 46 is a heat-resistant conductive wire. The terminal 47 is a T-shaped terminal. The terminal 47 is inserted into the hole 35. The terminal 47 makes contact with the end electrode 33. The lead wire (not illustrated) connected to the end electrode 34 is also configured similarly to the lead wire 45. The connection between the end electrode 33 and the lead wire 45 and the connection between the end electrode 34 and the lead wire (not illustrated) are covered by an insulation coating 48.

According to the modification example, a T-shaped terminal can be used to easily connect the end electrode 33 to the lead wire 45 and the end electrode 34 to a lead wire (not illustrated). The connection between the end electrode 33 and the lead wire 45 and the connection between the end electrode 34 and the lead wire (not illustrated) can be sealed by the insulation coating 48.

SECOND MODIFICATION EXAMPLE

Figure 9:
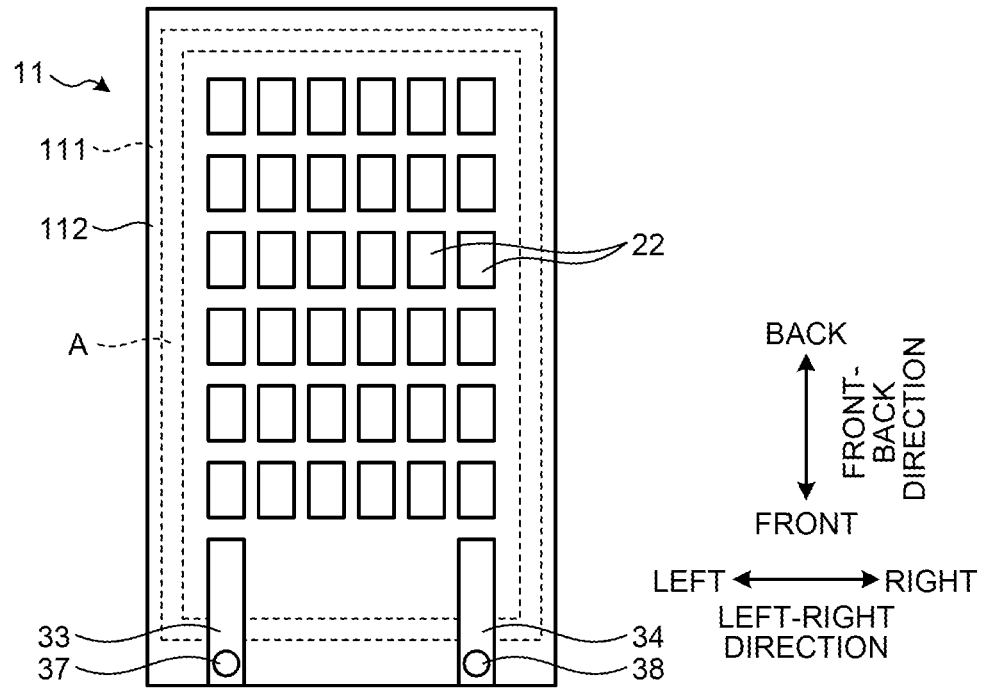
FIG. 9 is a plan view schematically illustrating, from above, the first base material of the thermoelectric generator module according to a second modification example.
Figure 10:
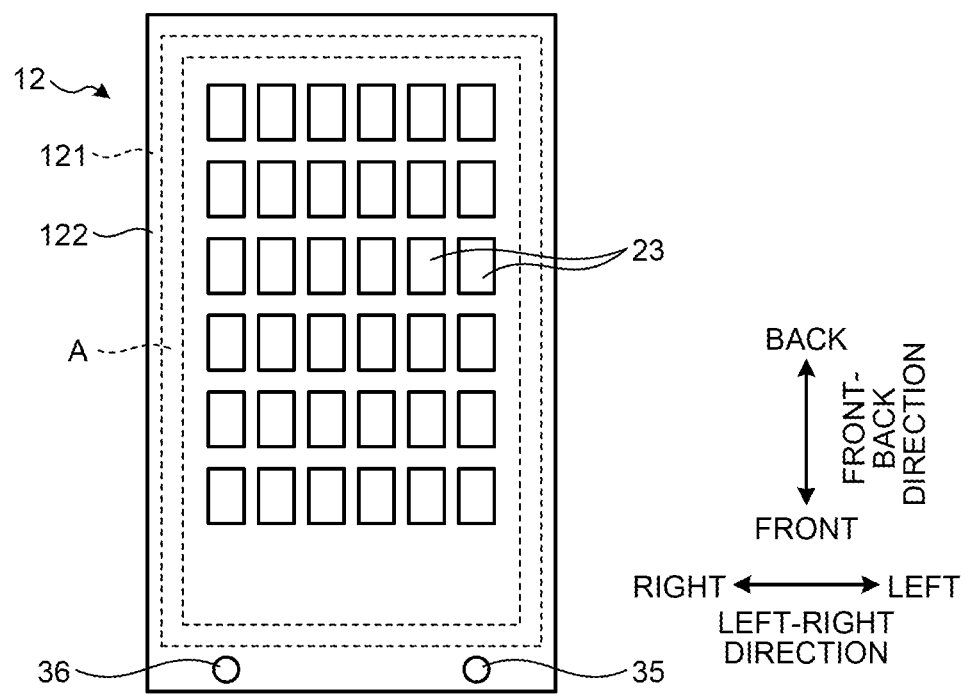
FIG. 10 is a plan view schematically illustrating, from below, the second base material of the thermoelectric generator module according to the second modification example.
Figure 11:
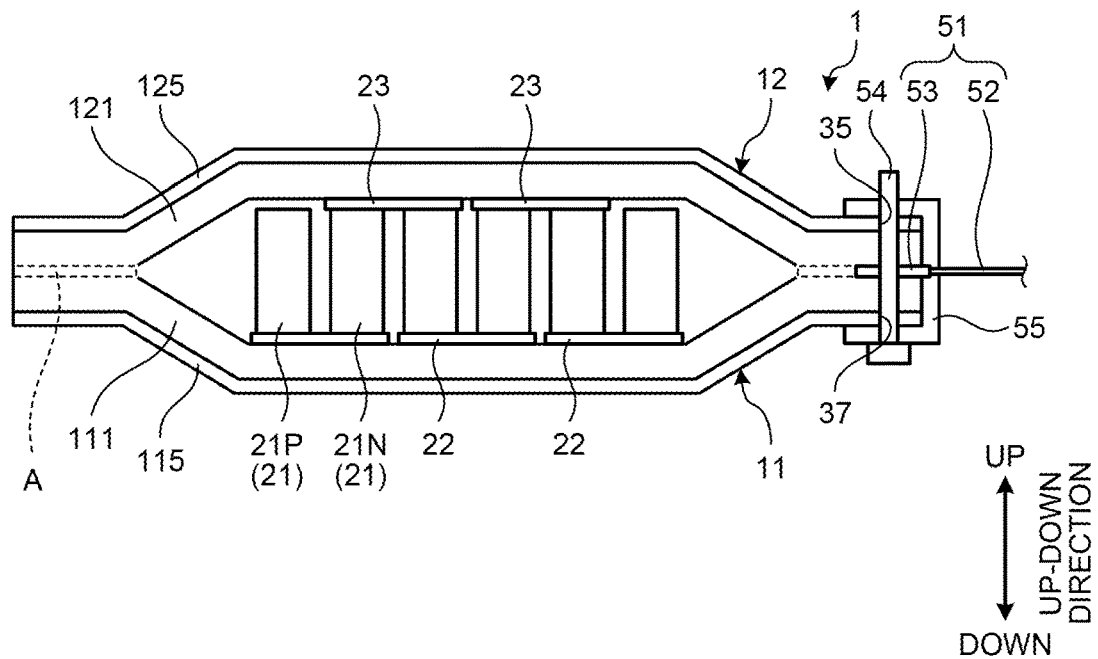
FIG. 11 is a cross-sectional view schematically illustrating the thermoelectric generator module according to the second modification example.

FIG. 9 is a plan view schematically illustrating, from above, the first base material of the thermoelectric generator module according to a second modification example. FIG. 10 is a plan view schematically illustrating, from below, the second base material of the thermoelectric generator module according to the second modification example. FIG. 11 is a cross-sectional view schematically illustrating the thermoelectric generator module according to the second modification example. The second modification example differs from the first modification example in the configuration of the power extraction unit of the circuit.

A hole 37 and a hole 38 are formed on the outside of the joint A of the first base material 11, and the hole 35 and the hole 36 are formed on the outside of the joint A of the second base material 12.

The hole 37 is formed on the end electrode 33, and the hole 38 is formed on the end electrode 34. The holes 37 and 38 are formed so as to penetrate the first base material 11. The holes 37 and 38 are arranged on the outside of the joint A. The diameters of the holes 37 and 38 are smaller than the diameters of the holes 35 and 36.

The holes 35 and 36 are formed so as to penetrate the second base material 12. The holes 35 and 36 are arranged in positions opposite the holes 37 and 38 while the first base material 11 and the second base material 12 are stacked on top of each other.

A lead wire (conductor) 51 is electrically connected to the end electrode 33 exposed on the top surface side of the first base material 11. The lead wire 51 has a conductive wire 52, and a terminal 53 that is disposed at the distal end of the conductive wire 52. The conductive wire 52 is a heat-resistant conductive wire. The terminal 53 is an O-shaped or U-shaped terminal. The terminal 53 makes contact with the end electrode 33. The terminal 53 is fixed by an insulating screw 54 that is inserted into the holes 35 and 37. The insulating screw 54 is inserted into the hole 35, the hole 37, and the terminal 53. The lead wire (not illustrated) connected to the end electrode 34 is also configured similarly to the lead wire 51. The connection between the end electrode 33 and the lead wire 51, and the connection between the end electrode 34 and a lead wire (not illustrated), are covered by an insulation coating 55.

According to the modification example, an O-shaped or U-shaped terminal can be used to easily connect the end electrode 33 to the lead wire 45 and the end electrode 34 to a lead wire (not illustrated).

THIRD MODIFICATION EXAMPLE

Figure 12:
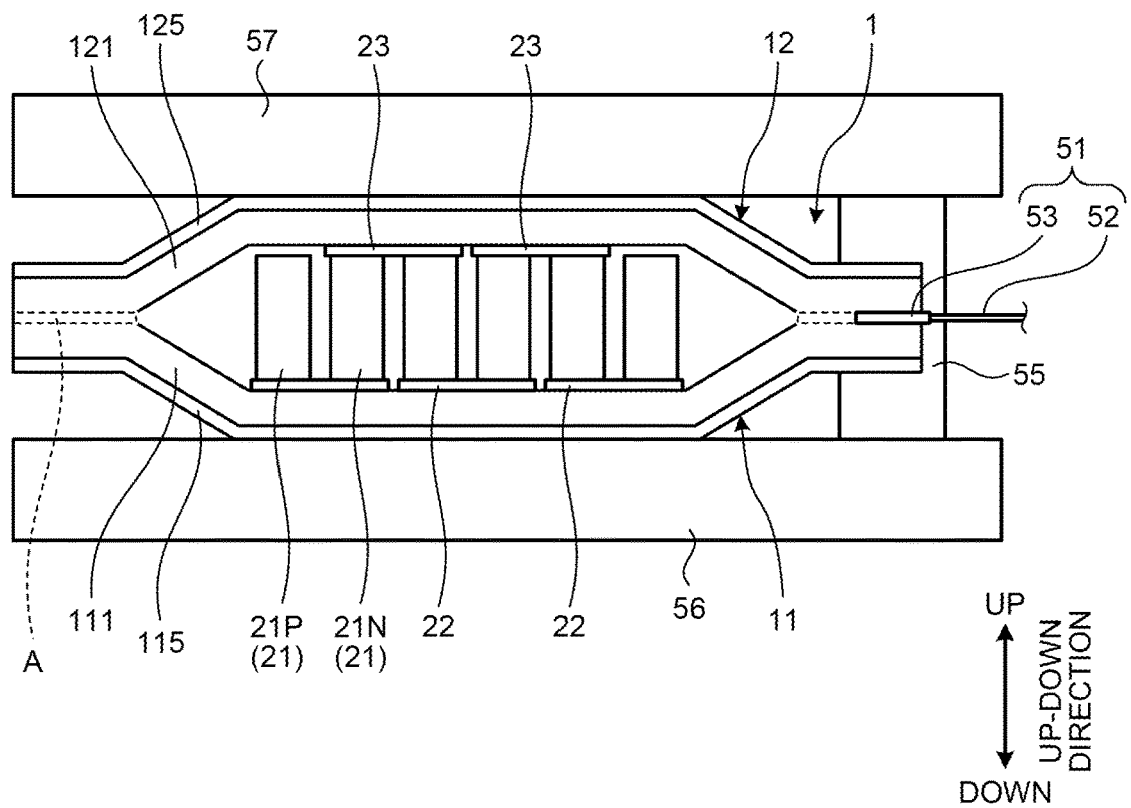
FIG. 12 is a cross-sectional view schematically illustrating the thermoelectric generator module according to a third modification example.

FIG. 12 is a cross-sectional view schematically illustrating the thermoelectric generator module according to a third modification example. The third modification example differs from the second modification example in that the connection between the end electrode (not illustrated) and the lead wire 51, is sandwiched between a high-temperature plate 56 and a low-temperature plate 57, and the insulation coating 55 is pressed in the up-down direction so as to be sealed. In the third modification example, the insulating pin 54 is not used.

The insulation coating 55 is applied to fill the space between the high-temperature plate 56 and the low-temperature plate 57 at the connection between the end electrode 33 and the lead wire 51 and the connection between the end electrode 34 and the lead wire (not illustrated).

The high-temperature plate 56 is in surface contact with the third layer 115, which is disposed on the bottom surface side of the first electrode 22 arranged on the first base material 11. The high-temperature plate 56 is installed in a facility. The high-temperature plate 56 is a rectangular, plate-like member. The high-temperature plate 56 is formed by a material with high thermal conductivity. The high-temperature plate 56 is formed by a metal such as steel or an aluminum alloy, for example. The high-temperature plate 56 receives heat from the facility. The heat of the high-temperature plate 56 is conducted to the thermoelectric generator module 1 via a heat transfer member (not illustrated).

The low-temperature plate 57 is in surface contact with the third layer 125, which is disposed on the top surface side of the second electrode 23 arranged on the second base material 12. The low-temperature plate 57 is installed facing and separated from the high-temperature plate 56 in the up-down direction. The low-temperature plate 57 is a rectangular, plate-like member. The low-temperature plate 57 is formed by a material with high thermal conductivity. The low-temperature plate 57 is formed by a metal, such as steel or aluminum alloy, for example. The low-temperature plate 57 receives heat from the thermoelectric generator module 1. The heat of the low-temperature plate 57 is dissipated to the surroundings of the thermoelectric generator device or is water-cooled.

According to the modification example, the connection between the end electrode 33 and the lead wire 51 and the connection between the end electrode 34 and the lead wire (not illustrated) can be pressed and sealed by the high-temperature and low-temperature plates of the thermoelectric generator device.

FOURTH MODIFICATION EXAMPLE

Figure 13:
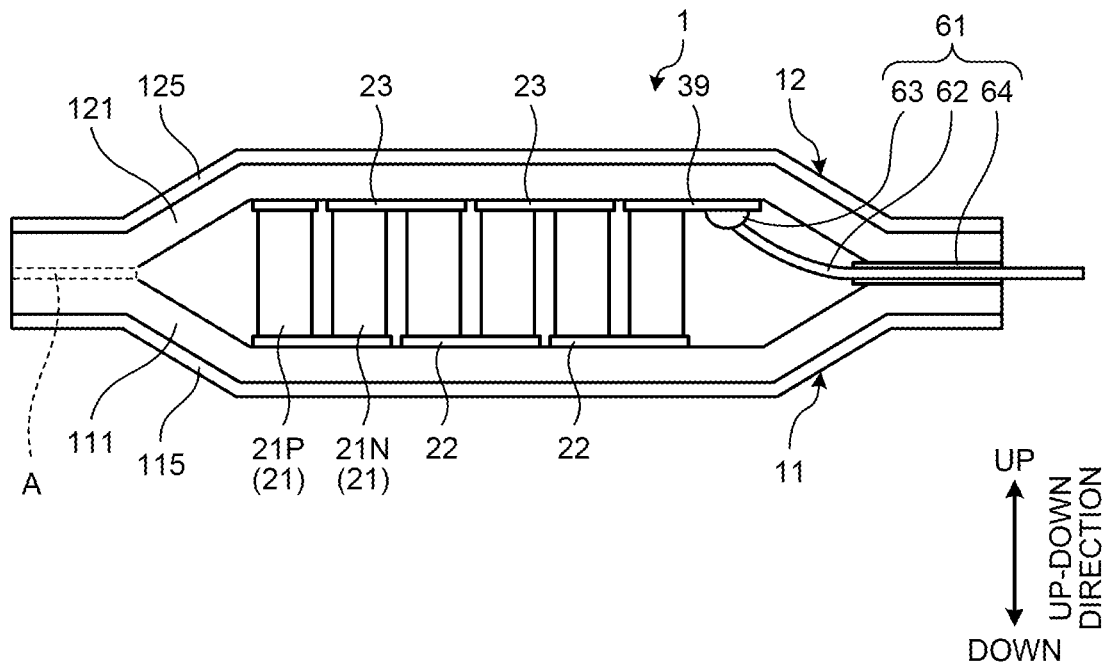
FIG. 13 is a cross-sectional view schematically illustrating the thermoelectric generator module according to a fourth modification example.

FIG. 13 is a cross-sectional view schematically illustrating the thermoelectric generator module according to a fourth modification example. The fourth modification example differs from the embodiment in the configuration of the power extraction unit of the circuit. Inside the joint A, a lead wire (conductor) 61, which is connected to the first electrode 22 or the second electrode 23, is provided.

The lead wire 61 has a conductive wire 62, a terminal 63 that is disposed at the distal end of the conductive wire 62, and a coating portion 64 that covers the conductive wire 62. The conductive wire 62 is a heat-resistant conductive wire. The conductive wire 62 extends to the outside of the joint A. The terminal 63 is connected to the first electrode 22 or the second electrode 23. In the fourth modification example, the terminal 63 is connected to an end electrode 39 disposed on the first base material 11, on the inside of the joint A.

A case where the coating portion 64 is cylindrical, that is, a hollow member, will now be described. Insert the conductive wire 62 into the hollow of the coating portion 64.

The conductive wire 62 exhibits poor bonding to polyimide. Thus, the conductive wire 62 is covered by the coating portion 64 that is easily joined to the polyimide, for example. The coating portion 64 is formed, for example, in the form of a hollow cylinder or a ribbon with a lead wire sandwiched between insulating sheets. In order to join the thermoplastic layer 112 to the thermoplastic layer 122, the coating portion 64 is configured from a material that enables joining of the thermoplastic layer 112 of the first base material 11 to the thermoplastic layer 122 of the second base material 12. The outer peripheral surface of the coating portion 64 is formed from a material which has thermoplasticity. The coating portion 64 is interposed between the thermoplastic layer 112 and the thermoplastic layer 122 at the joint A. The coating portion 64 is joined to the thermoplastic layer 112 and the thermoplastic layer 122 at the joint A so as to seal the layers.

The coating portion 64 has electrical insulation properties. The coating portion 64 is configured from a rigid material in order to protect the inner conductive wire 62. The use of a rigid material as the coating portion 64 makes the conductive wire 62 bend and prevents stress from being applied to the thermoelectric conversion element 21. The coating portion 64 is sealed by providing a lid (not illustrated) to the power extraction unit of the circuit or by filling the inside of the coating portion 64 with a moisture-impermeable material such as fluorocarbon resin.

According to the modification example, the power of the circuit can be extracted from the inside of the joint A. According to the modification example, using a rigid material as the coating portion 64 makes it possible to bend the conductive wire 62 and prevent stress from being applied to the thermoelectric conversion element 21.

FIFTH MODIFICATION EXAMPLE

Figure 14:
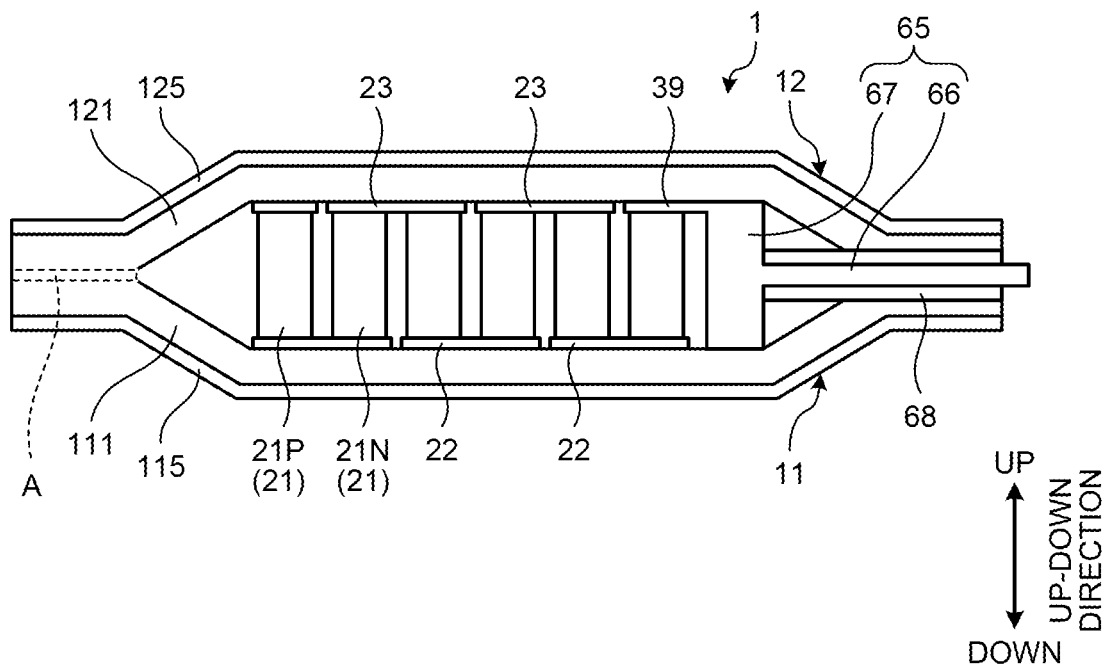
FIG. 14 is a cross-sectional view schematically illustrating the thermoelectric generator module according to a fifth modification example.
Figure 15:
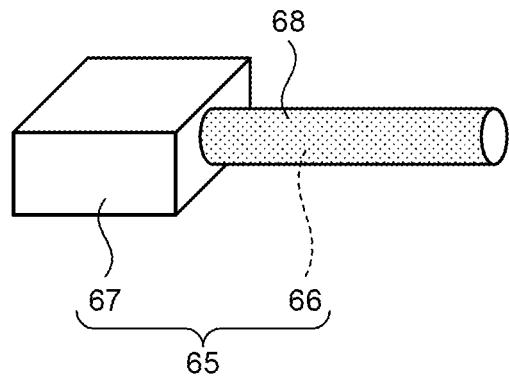
FIG. 15 is a schematic diagram schematically illustrating an example of a conductor.
Figure 16:
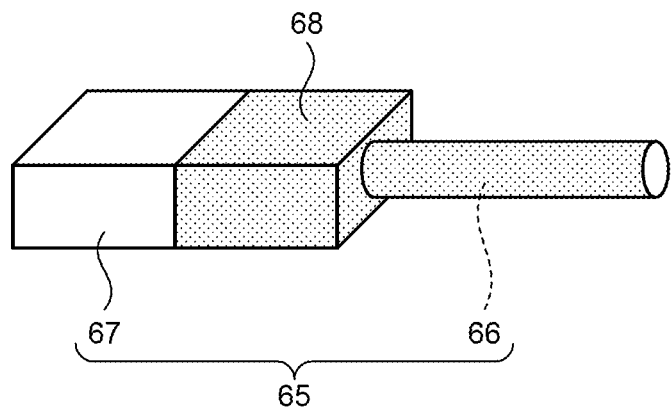
FIG. 16 is a schematic diagram schematically illustrating another example of a conductor.
Figure 17:
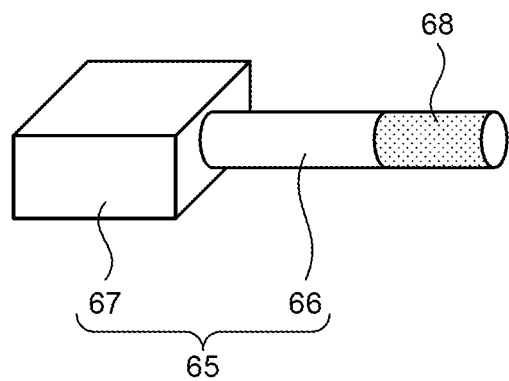
FIG. 17 is a schematic diagram schematically illustrating another example of a conductor.

FIG. 14 is a cross-sectional view schematically illustrating the thermoelectric generator module according to a fifth modification example. FIG. 15 is a schematic diagram schematically illustrating an example of a conductor. FIG. 16 is a schematic diagram schematically illustrating another example of a conductor. FIG. 17 is a schematic diagram schematically illustrating another example of a conductor. The fifth modification example differs from the embodiment in the configuration of the power extraction unit of the circuit.

A conductor 65 has a shaft 66 and a distal end 67. The shaft 66 and the distal end 67 are integrally configured from an electrically conductive material. The distal end 67 is connected to the end electrode 39.

The conductor 65 is covered on at least part of its outer periphery by an insulation coating 68. The insulation coating 68 is configured from a material having thermoplasticity. In FIGS. 15 to 17, the insulation coating 68 is colored for illustrative purposes. As illustrated in FIG. 15, the conductor 65 may have the insulation coating 68 only on the shaft 66. As illustrated in FIG. 16, the conductor 65 may have the insulation coating 68 on part of the shaft 66 and the distal end 67. As illustrated in FIG. 17, the conductor 65 may have the insulation coating 68 on part of the shaft 66.

According to the modification example, the conductor 65 is capable of extracting power to the outside of the circuit without bending. According to the modification example, unnecessary stress does not act on the power extraction unit of the circuit, and hence durability can be maintained.

Second Embodiment

Figure 18:
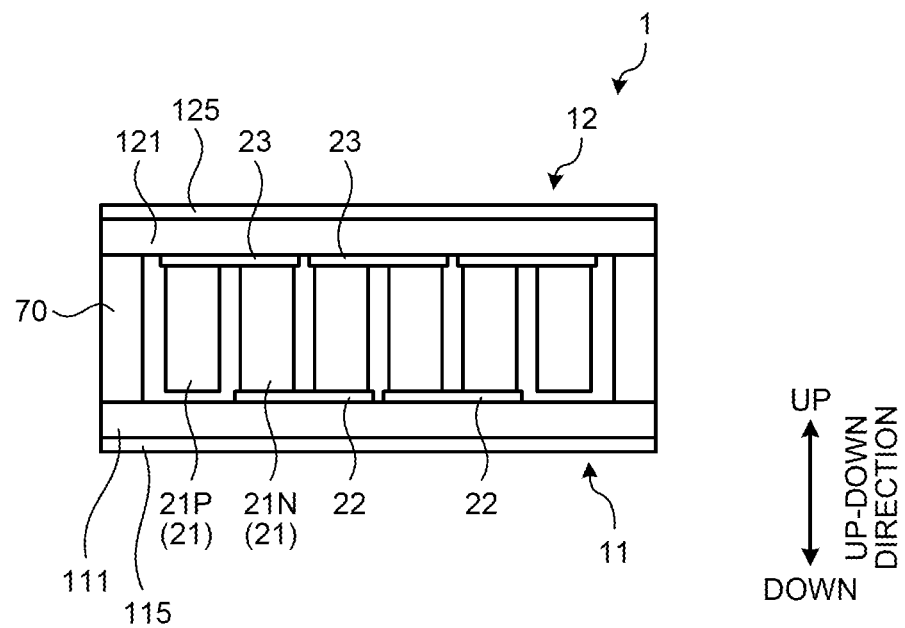
FIG. 18 is a cross-sectional view schematically illustrating the thermoelectric generator module according to a second embodiment.

FIG. 18 is a cross-sectional view schematically illustrating the thermoelectric generator module according to a second embodiment. This module differs from that of the first embodiment in having a sealing frame 70.

The sealing frame 70 is a liquid gasket configured from ultra-high heat-resistant silicon, for example. The sealing frame 70 is disposed at the joint A. The sealing frame 70 is formed in the shape of a rectangular frame. The sealing frame 70 is disposed on a peripheral portion between the first base material 11 and the second base material 12 in the up-down direction view. The sealing frame 70 is interposed between the thermoplastic layer 112 of the first base material 11 and the thermoplastic layer 122 of the second base material 12 at the joint A. The sealing frame 70 has the same thickness as the thickness of the stacked thermoelectric conversion elements 21, first electrode 22, and second electrode 23.

The sealing frame 70 is made of a material with a lower thermal conductivity than the high-temperature plate and low-temperature plate. Thus, heat leakage via the sealing frame 70 is suppressed.

The sealing frame 70 is formed from a heat-resistant material. In more detail, the sealing frame 70 is formed from a material that can withstand temperatures of about 250° C. and be used in a condensing environment over a long period of time.

The embodiment enables improvements in sealing performance by using a liquid gasket.

Third Embodiment

Figure 19:
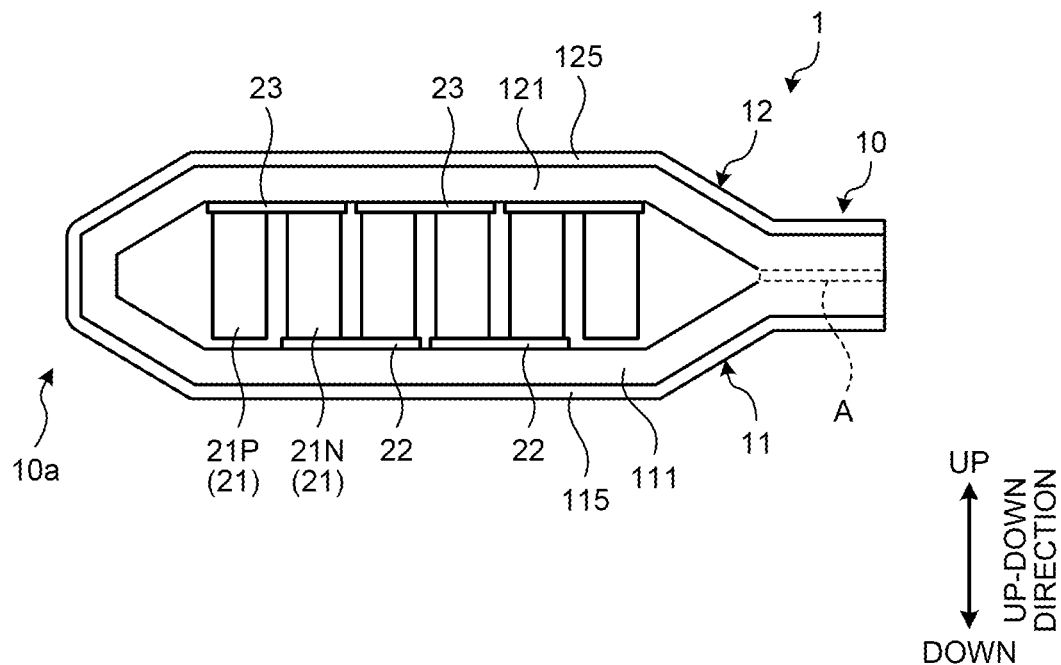
FIG. 19 is a cross-sectional view schematically illustrating the thermoelectric generator module according to a third embodiment.
Figure 20:
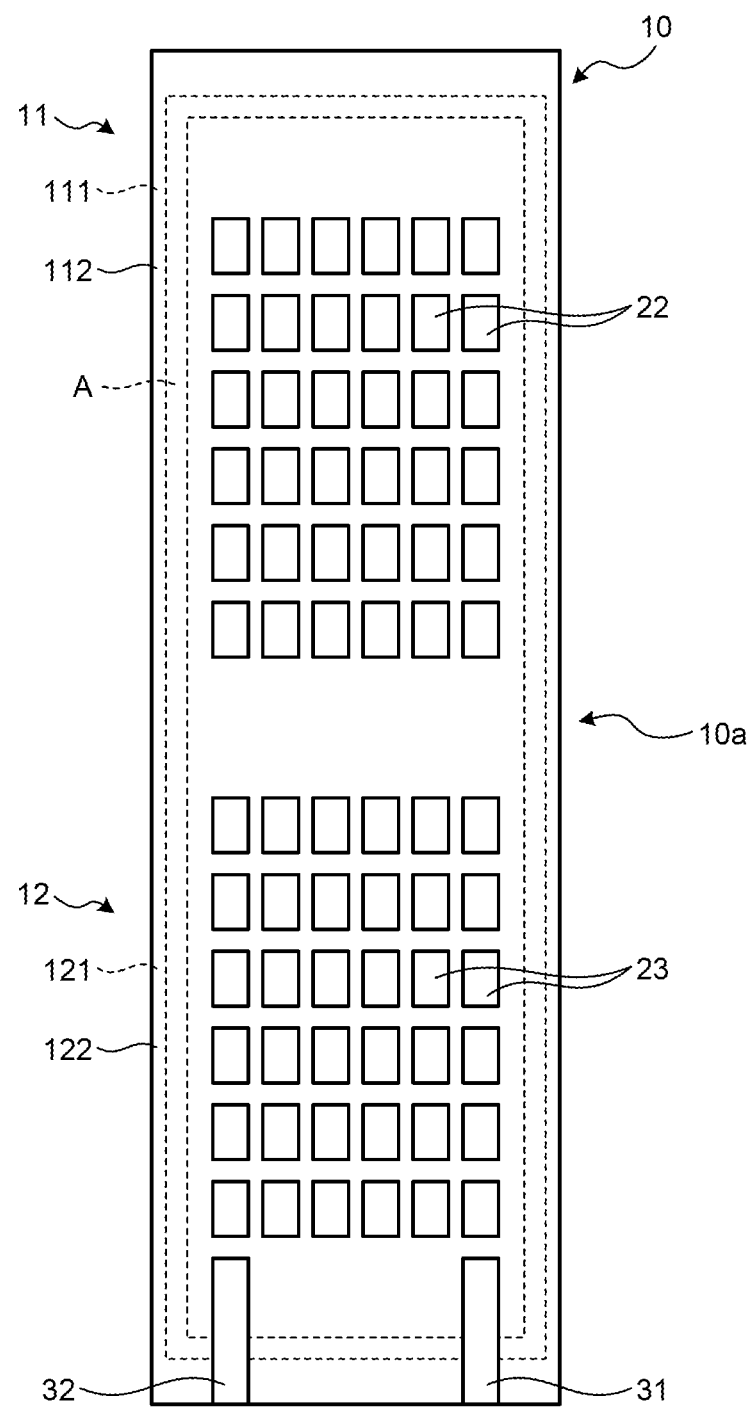
FIG. 20 is a plan view schematically illustrating the first base material and the second base material of the thermoelectric generator module according to the third embodiment.

FIG. 19 is a cross-sectional view schematically illustrating the thermoelectric generator module according to a third embodiment. FIG. 20 is a plan view schematically illustrating the first base material and the second base material of the thermoelectric generator module according to the third embodiment. This module differs from that of the first embodiment in having a sealing frame 70.

The first base material 11 and the second base material 12 are configured from one sheet-like base material 10 that is bent. In the embodiment, the lower side of a bent portion 10a is the first base material 11, and the upper side is the second base material 12.

The joint A is disposed on a peripheral portion excluding the bent portion 10a of the base material 10. In the rectangular base material 10, three sides are the joint A, and one side is the bent portion 10a.

The embodiment enables a reduction in the surface area of the joint A. The embodiment enables an improvement in the sealing performance.

FURTHER MODIFICATION EXAMPLE

The cover 44 that covers the connection between the end electrode 31 and the lead wire 41 is not limited to heat shrink tubing, and can also be a resin molding or an insulation coating.

The present disclosure enables the heat resistance to be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A thermoelectric generator module, comprising:
   a first base material that is formed into a sheet and that has a thermoplastic layer;
   a second base material that is formed into a sheet and that has a thermoplastic layer;
   a plurality of thermoelectric conversion elements arranged between the first base material and the second base material;
   a plurality of first electrodes arranged between the first base material and the plurality of thermoelectric conversion elements;
   a plurality of second electrodes arranged between the second base material and the plurality of thermoelectric conversion elements; and
   a joint that joins the first base material to the second base material,
   wherein the plurality of thermoelectric conversion elements, the plurality of first electrodes, and the plurality of second electrodes are sealed by the joint, and
   wherein the thermoplastic layer of the first base material and the thermoplastic layer of the second base material extend to the joint and are connected to each other.

2. The thermoelectric generator module according to claim 1, further comprising:
   at the joint, a liquid gasket that is interposed between the thermoplastic layer of the first base material and the thermoplastic layer of the second base material.

3. The thermoelectric generator module according to claim 1, wherein the first base material and the second base material are formed by bending one sheet-like base material, and
   wherein one side of the one sheet-like base material relative to a bent portion of the one sheet-like base material is the first base material, and the other side of the one sheet-like base material relative to the bent portion of the one sheet-like base material is the second base material.

4. The thermoelectric generator module according to claim 1, further comprising:
an end electrode that is disposed on the first base material or the second base material, and that extends from an inside of the joint to an outside of the joint; and
a conductor that is connected to the end electrode, on the outside of the joint.

5. The thermoelectric generator module according to claim 4, further comprising:
a hole that penetrates the outside of the joint of the first base material or the second base material,
wherein the conductor has a conductive wire, and a T-shaped terminal that is disposed at a distal end of the conductive wire, and
wherein the T-shaped terminal is inserted into the hole.

6. The thermoelectric generator module according to claim 4, further comprising:
a first hole that penetrates the outside of the joint of the first base material;
a second hole that penetrates the outside of the joint of the second base material; and
an insulating screw that is inserted into the first hole of the first base material and the second hole of the second base material,
wherein the conductor has a conductive wire, and an O-shaped or U-shaped terminal that is disposed at a distal end of the conductive wire, and
wherein the insulating screw is inserted into the first hole of the first base material, the second hole of the second base material, and the O-shaped or U-shaped terminal.

7. The thermoelectric generator module according to claim 4, wherein a connection between the end electrode and the conductor is sealed by being covered by heat shrink tubing, a resin molding, or an insulation coating.

8. The thermoelectric generator module according to claim 4, wherein a connection between the end electrode and the conductor is sandwiched by a high-temperature plate and a low-temperature plate, and is sealed by being pressed in a thickness direction.

9. The thermoelectric generator module according to claim 1, further comprising:
on an inside of the joint, a conductor that is connected to the plurality of first electrodes or the plurality of second electrodes,
wherein the conductor extends to an outside of the joint.

10. The thermoelectric generator module according to claim 9, wherein the conductor has a conductive wire, a terminal disposed at a distal end of the conductive wire, and a coating portion that covers the conductive wire,
wherein the terminal is connected to the plurality of first electrodes or the plurality of second electrodes, and
wherein an outer peripheral surface of the coating portion is formed from a material having thermoplasticity, and, at the joint, is interposed between the thermoplastic layer of the first base material and the thermoplastic layer of the second base material.

11. The thermoelectric generator module according to claim 9, wherein the conductor is at least partially insulation-coated with a material having thermoplasticity.

12. The thermoelectric generator module according to claim 1, wherein the joint defines a peripheral portion of the thermoelectric generator module, and
wherein the thermoplastic layer of the first base material and the thermoplastic layer of the second base material are joined to each other by heating the joint.

13. The thermoelectric generator module according to claim 1, wherein the joint defines a left end and a right end of each of the first base material and the second base material, and
wherein a left-right length of the first base material between the left and right ends of the first base material is equal to a left-right length of the second base material between the left and right ends of the second base material.

14. A thermoelectric generator module, comprising:
a first base material that is formed into a sheet and that has a thermoplastic layer;
a second base material that is formed into a sheet and that has a thermoplastic layer;
a plurality of thermoelectric conversion elements arranged between the first base material and the second base material;
a plurality of first electrodes arranged between the first base material and the plurality of thermoelectric conversion elements;
a plurality of second electrodes arranged between the second base material and the plurality of thermoelectric conversion elements; and
a joint that joins the first base material to the second base material,
wherein the plurality of thermoelectric conversion elements, the plurality of first electrodes, and the plurality of second electrodes are sealed by the joint,
wherein the first base material has a metal layer that is laminated on the thermoplastic layer,
wherein the second base material has a metal layer that is laminated on the thermoplastic layer,
wherein the first electrode is formed by processing the metal layer of the first base material, and
wherein the second electrode is formed by processing the metal layer of the second base material.

15. A thermoelectric generator module, comprising:
a first base material that is formed into a sheet and that has a thermoplastic layer;
a second base material that is formed into a sheet and that has a thermoplastic layer;
a plurality of thermoelectric conversion elements arranged between the first base material and the second base material;
a plurality of first electrodes arranged between the first base material and the plurality of thermoelectric conversion elements;
a plurality of second electrodes arranged between the second base material and the plurality of thermoelectric conversion elements; and
a joint that joins the first base material to the second base material,
wherein the plurality of thermoelectric conversion elements, the plurality of first electrodes, and the plurality of second electrodes are sealed by the joint,
wherein the first base material has a shield layer that is laminated on the thermoplastic layer, and
wherein the second base material has a shield layer that is laminated on the thermoplastic layer.

* * * * *